United States Patent
Chou et al.

(10) Patent No.: US 9,594,096 B2
(45) Date of Patent: Mar. 14, 2017

(54) PROBE CARD FOR SIMULTANEOUSLY TESTING MULTIPLE DIES

(71) Applicant: Taiwan Semiconductor Manufacturing Company, Ltd., Hsin-Chu (TW)

(72) Inventors: You-Hua Chou, Hsin-Chu (TW); Yi-Jen Lai, Chang Hua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 536 days.

(21) Appl. No.: 13/969,284

(22) Filed: Aug. 16, 2013

(65) Prior Publication Data

US 2013/0328586 A1 Dec. 12, 2013

Related U.S. Application Data

(62) Division of application No. 12/817,735, filed on Jun. 17, 2010, now Pat. No. 8,564,319.

(51) Int. Cl.
*G01R 31/20* (2006.01)
*G01R 1/073* (2006.01)
*G01R 3/00* (2006.01)

(52) U.S. Cl.
CPC ..... *G01R 1/07307* (2013.01); *G01R 1/07314* (2013.01); *G01R 3/00* (2013.01)

(58) Field of Classification Search
CPC ............ G01R 1/07314; G01R 31/2886; G01R 1/0483; G01R 1/07378; G01R 1/06761; G01R 1/07307
See application file for complete search history.

(56) References Cited

U.S. PATENT DOCUMENTS

| | | | |
|---|---|---|---|
| 4,518,914 A * | 5/1985 | Okubo | G01R 1/07314 324/72.5 |
| 6,351,134 B2 | 2/2002 | Leas et al. | |
| 7,443,181 B2 | 10/2008 | Miller | |
| 7,714,603 B2 | 5/2010 | Eldridge et al. | |
| 2010/0117673 A1* | 5/2010 | Lee | G01R 31/2889 324/756.03 |
| 2010/0308855 A1* | 12/2010 | Pagani | B62M 25/04 324/756.03 |

OTHER PUBLICATIONS

Wu, J.H., et al., "A High Aspect-Ratio Silicon Substrate—Via Technology and Applications: Through-Wafer Interconnects for Power and Ground and Faraday Cages for SOC Isolation," 2000 IEEE, pp. 20.1.1-20.1.4.

* cited by examiner

*Primary Examiner* — Tung X Nguyen
(74) *Attorney, Agent, or Firm* — Slater Matsil, LLP

(57) ABSTRACT

In accordance with an embodiment, a probe card comprises a contact pad interface comprising front side contacts and back side contacts electrically coupled together. The front side contacts are arranged to simultaneously electrically couple respective bumps of a plurality of dies on a wafer, and the back side contacts are arranged to electrically couple respective contacts of a testing structure.

20 Claims, 10 Drawing Sheets

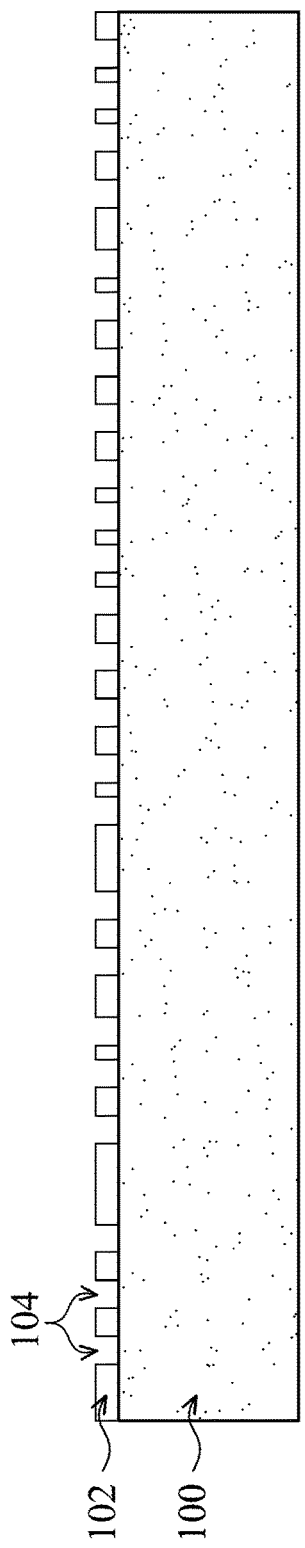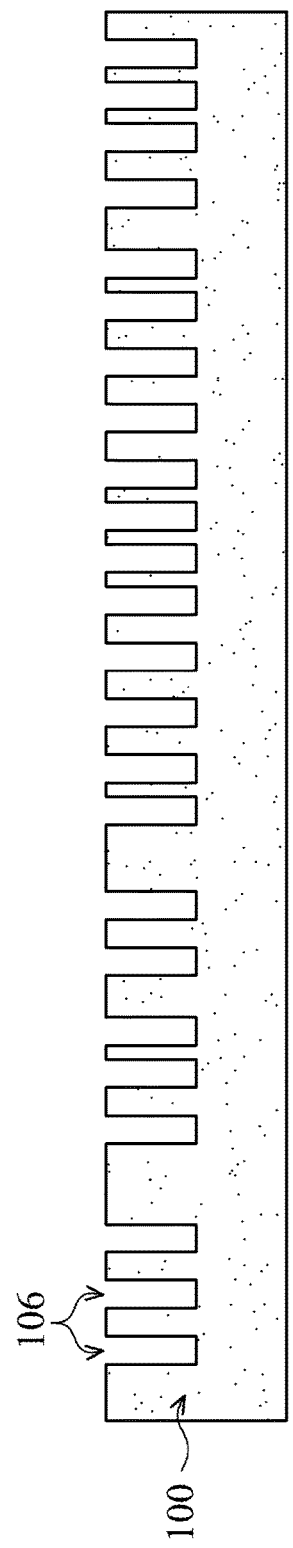

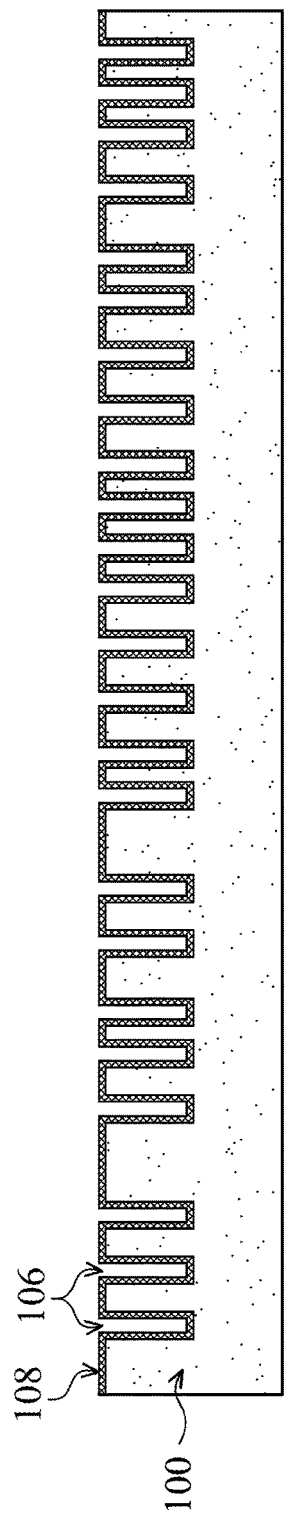
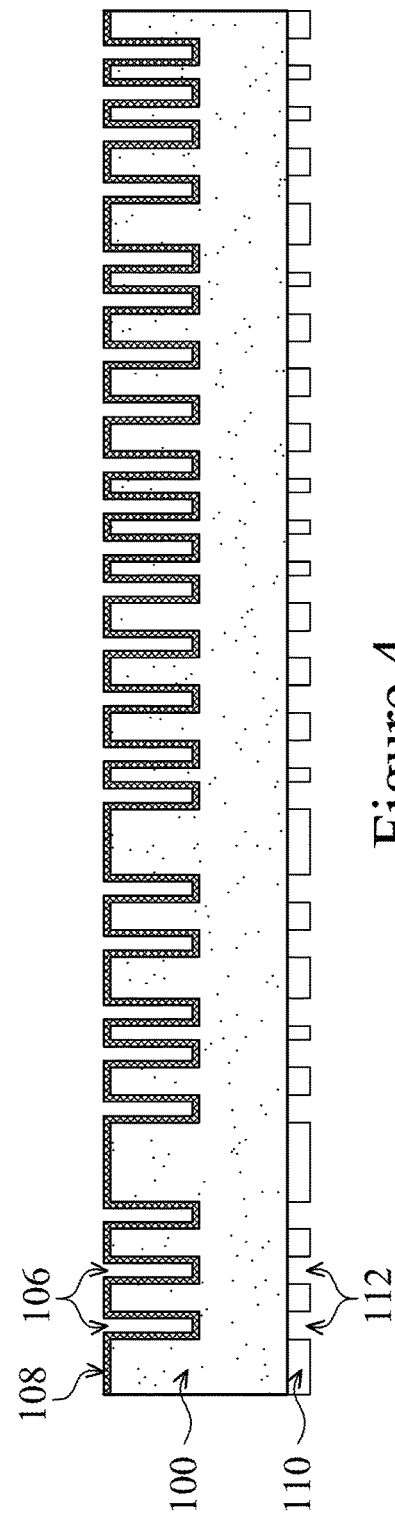

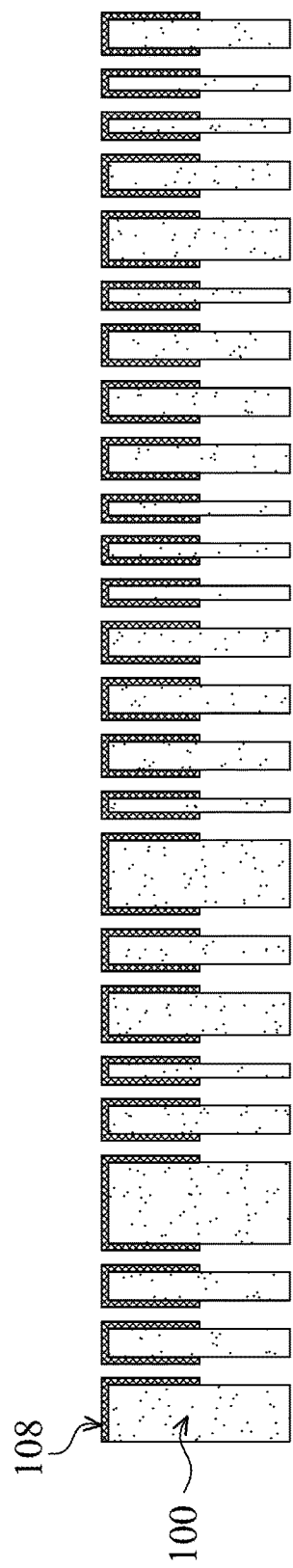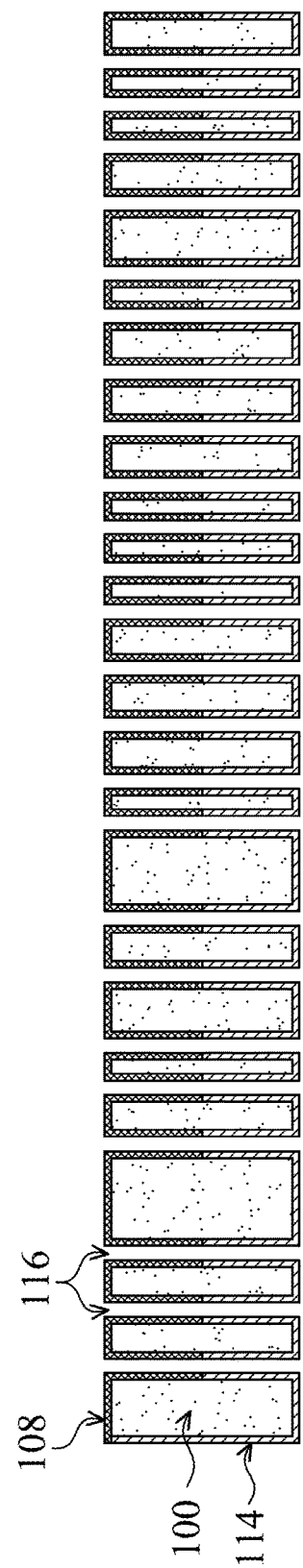

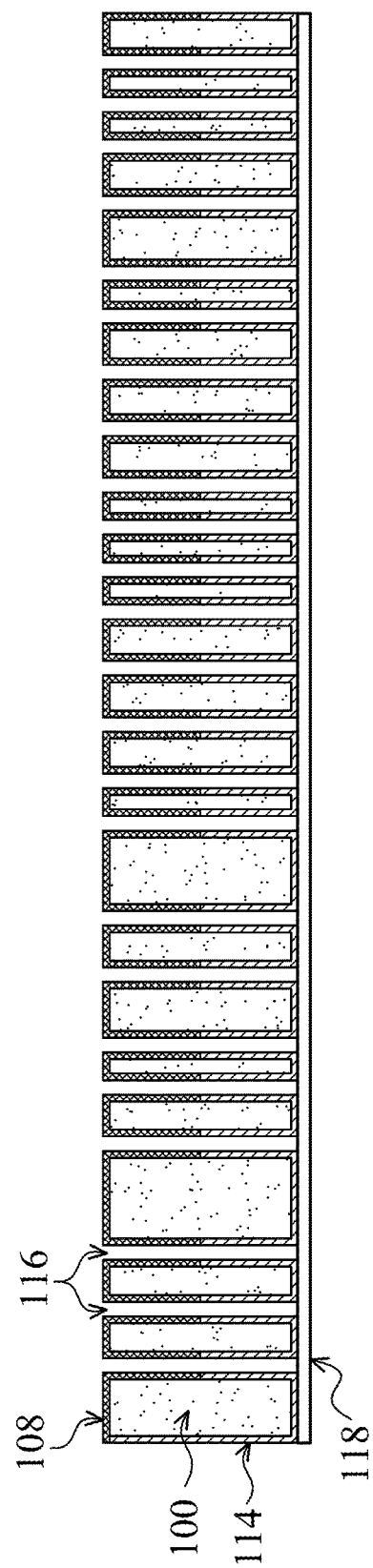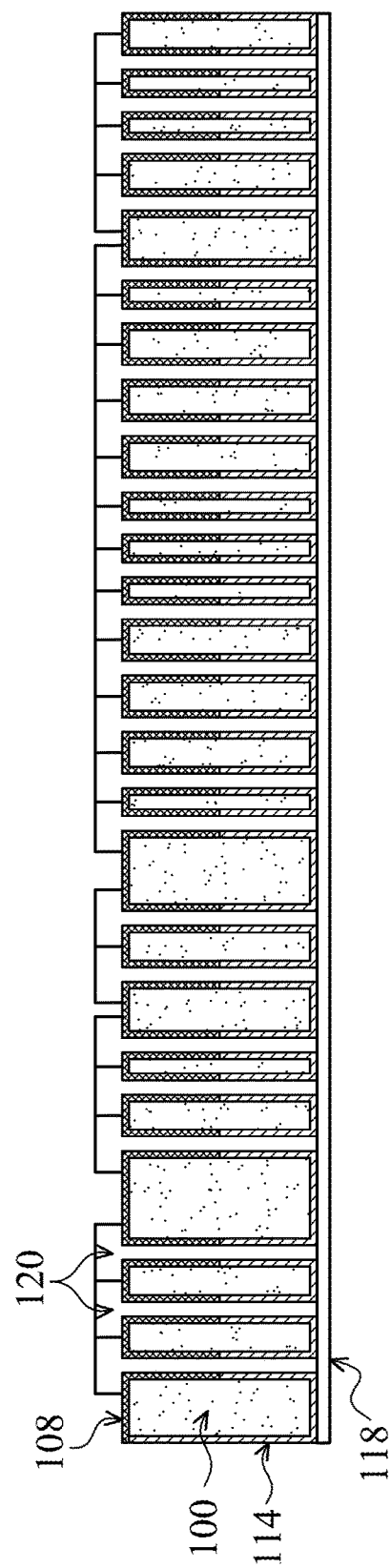

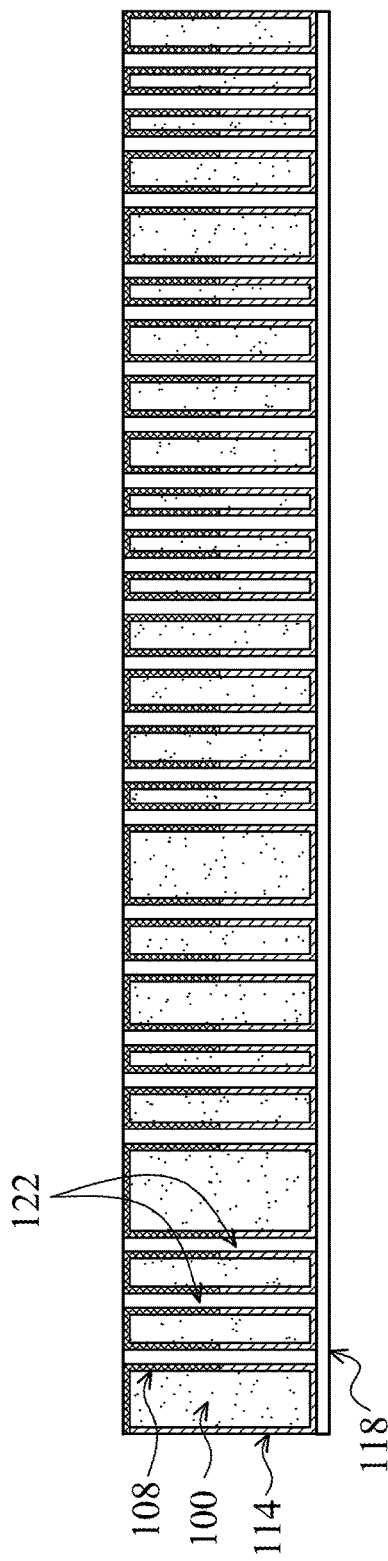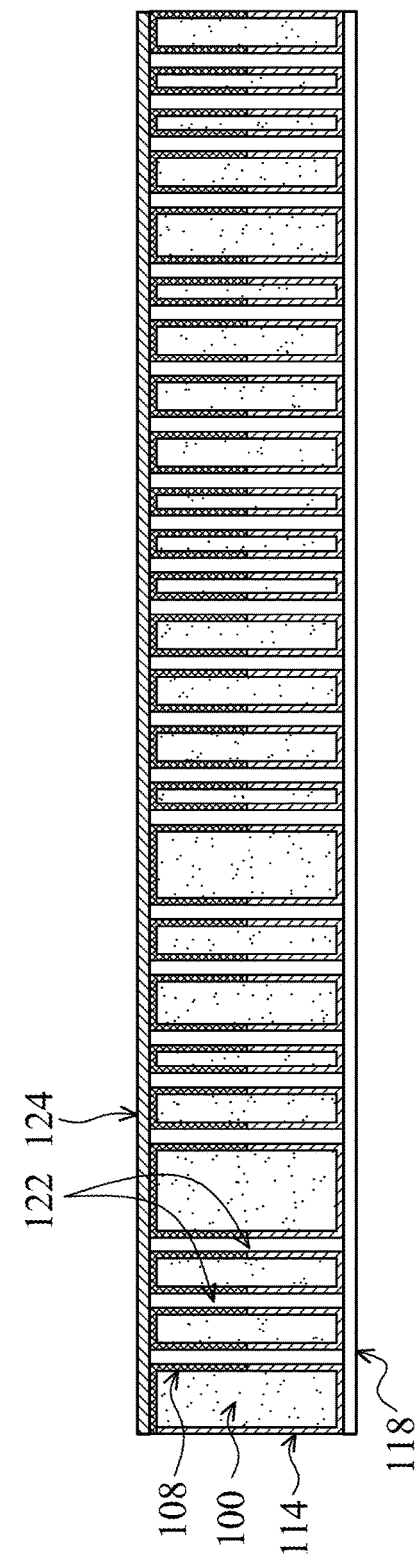
Figure 9
Figure 10

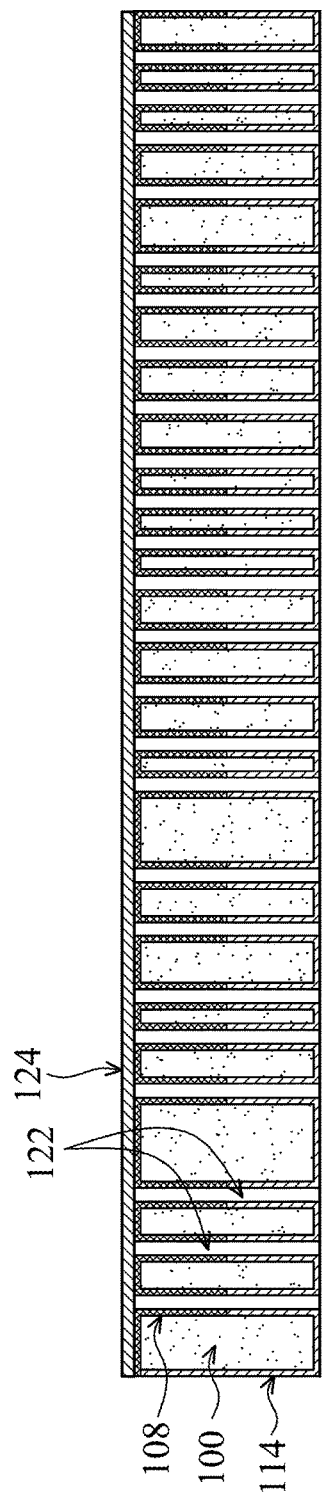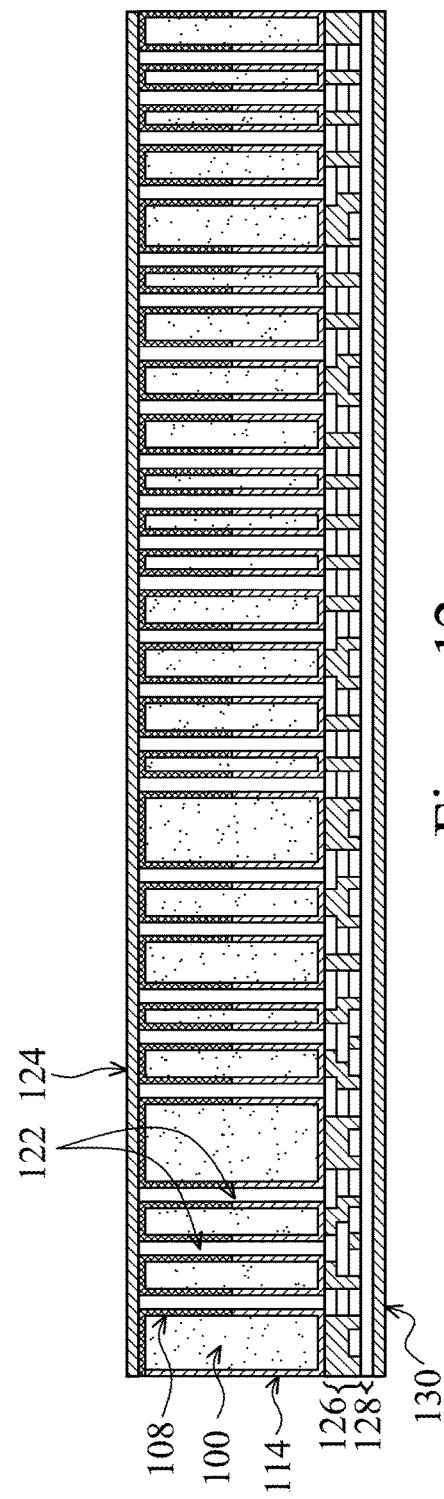

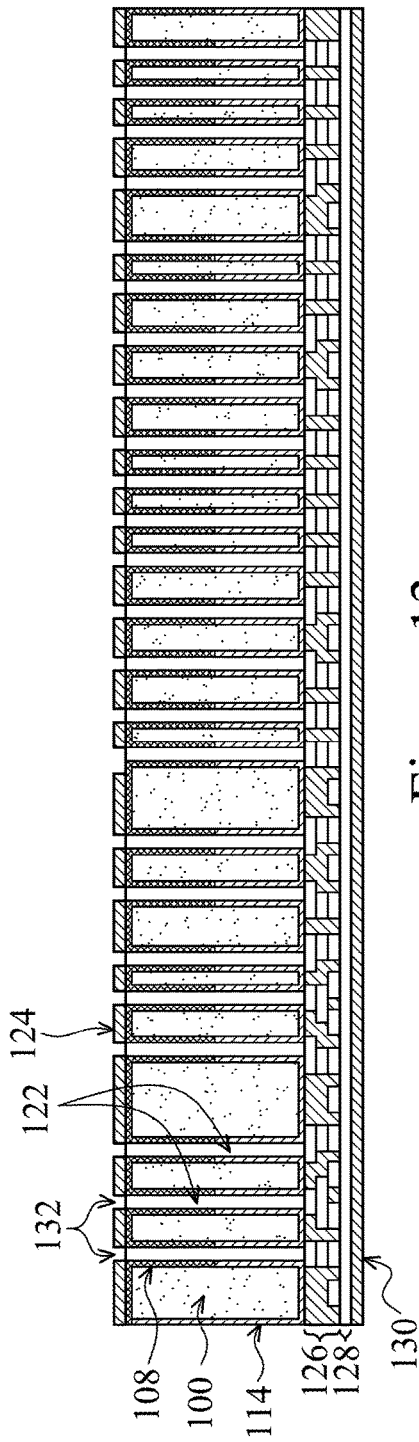
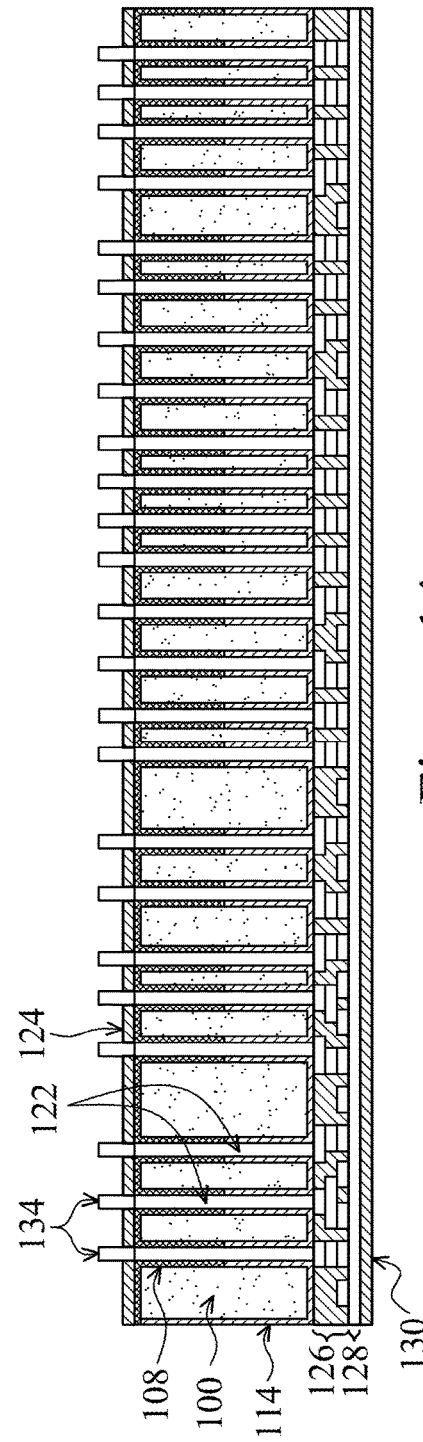
Figure 13
Figure 14

PROBE CARD FOR SIMULTANEOUSLY TESTING MULTIPLE DIES

This application is a divisional of U.S. patent application Ser. No. 12/817,735, filed on Jun. 17, 2010, entitled "Probe Card for Simultaneously Testing Multiple Dies," which application is hereby incorporated herein by reference in its entirety.

TECHNICAL FIELD

The present disclosure relates generally to testing semiconductor devices, a probe card for semiconductor device testing, and a method for forming the probe card.

BACKGROUND

In the manufacturing of integrated circuits and semiconductor dies, the circuits and semiconductor dies must be tested in order to ensure that a functional device has been manufactured. These tests are usually performed by contacting a test probe card to the relevant areas of the semiconductor die and performing one or more functional tests.

Conventional test probe cards are generally capable of testing one semiconductor die at a time. A typical probe card includes a probe needle that is capable of electrically coupling one semiconductor die during testing at any single moment. The probe therefore generally limits the number of dies tested at any one moment. Testing one die at a time may cause a low level of throughput of dies during the testing stage of manufacturing. This in turn may cause delay or lower levels of overall production and increased production costs.

Accordingly, what is needed in the art is a manner to overcome these stated deficiencies and test multiple dies simultaneously.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 16 are intermediate steps of forming a probe card contact pad interface according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments include a probe card that may simultaneously test multiple dies on a wafer, such as all of the dies on a wafer, and a method of operating the probe card. Other embodiments include a method to form a probe card that may be capable of simultaneously testing multiple dies on a wafer. Some of these embodiments will be described in detail in the following disclosure.

Figure 16:
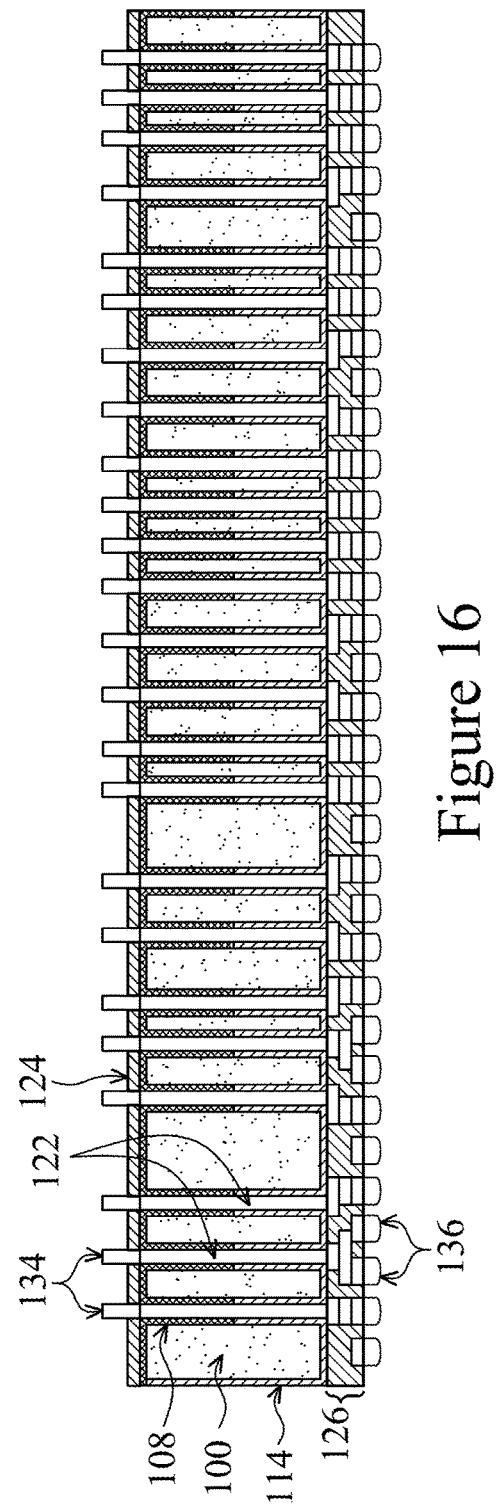
Figure 17:
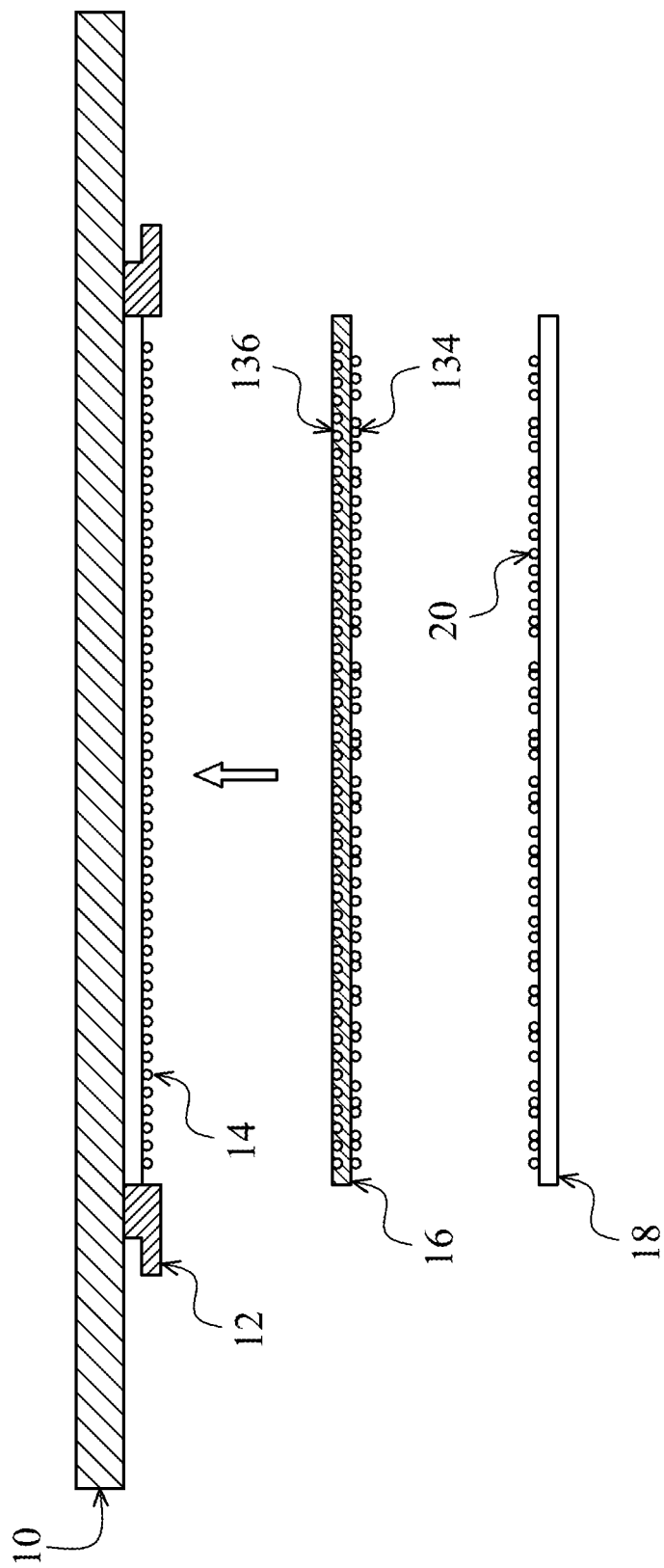
FIG. 17 is a probe card with the probe card contact pad interface according to another embodiment.
Figure 18:
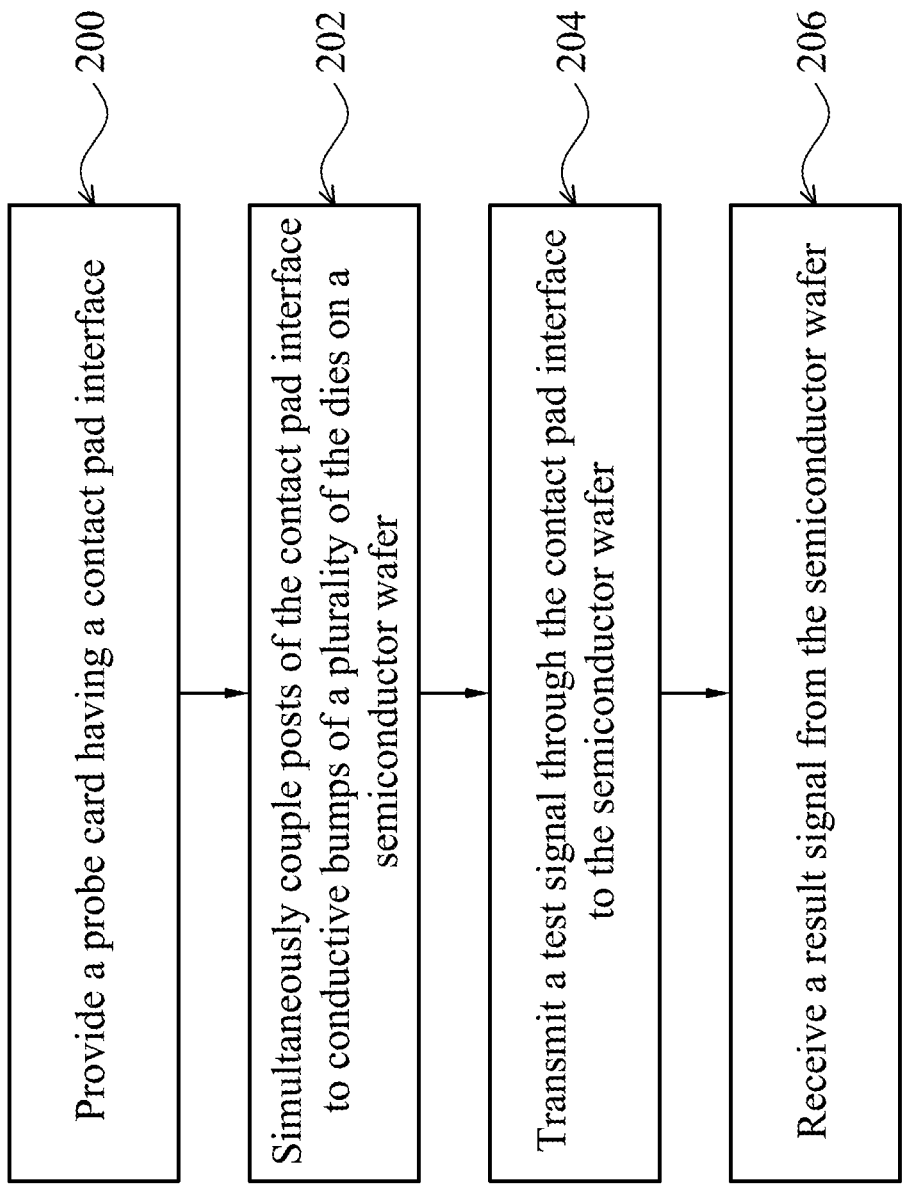
FIG. 18 is a method of testing semiconductor devices using the probe card according to a further embodiment.

FIGS. 1 through 16 illustrate intermediate steps of forming a probe card contact pad interface that is a component of a probe card according to an embodiment. FIG. 17 shows the probe card with the probe card contact pad interface described in FIGS. 1 through 16. As will become apparent in the following discussion, the probe card contact pad interface may allow the probe card to contact a multitude of dies on a wafer, and may allow contact to all of the dies on a wafer. FIG. 18 thus illustrates a method of testing semiconductor devices or a method of operating the probe card.

FIGS. 1 through 3 illustrate various steps of front side processing of a substrate. With reference now to FIG. 1, there is shown a substrate 100, such as high resistance silicon, with a photoresist layer 102 formed on a front side. The photoresist layer 102 comprises openings 104 that expose the substrate 100. The openings 104 may be formed using an acceptable lithography technique, such as by exposing the photoresist layer 102 to light using a mirror lithography mask. The mirror lithography mask may refer to a mirrored version of a lithography mask that is used to pattern and form openings through a passivation or dielectric layer during the formation of under bump metal (UBM) pads on dies of the wafer to be tested using the probe card contact interface. The openings 104 may be the areas in which through substrate vias (TSVs) may be formed. By using the mirror lithography mask at this step, posts that may be formed on the front side of the substrate 100 may align with and contact conductive bumps formed on dies of a wafer during testing, as will be discussed in detail later.

In FIG. 2, there is shown the substrate 100 after an etch step removes portions of the substrate 100 in the areas where the substrate 100 was exposed by the openings 104 in the photoresist layer 102. Thus, openings 104 in the photoresist layer 102 correspond to openings 106 in the substrate 100. The etch may be performed using an anisotropic etch. FIG. 2 further illustrates the substrate 100 after removal of the photoresist layer 102, such as by an ash/flush process. With reference now to FIG. 3, there is shown the substrate 100 with an etch stop layer 108 deposited on the front side of the substrate 100. The etch stop layer 108 may be conformal and may be silicon nitride, silicon oxide, silicon oxynitride, a combination thereof, and/or the like. The etch stop layer 108 may be deposited using any acceptable technique, such as a chemical vapor deposition (CVD) process.

FIGS. 4 through 6 illustrate steps of processing the back side of the substrate 100. With reference to FIG. 4, there is shown a photoresist layer 110 with openings 112 formed on the back side of the substrate 100. The openings 112 may expose portions the substrate 100. The openings 112 may be formed using an acceptable lithography technique, such as by exposing the photoresist layer 110 to light using a lithography mask, such that openings 112 align with previously formed openings 106 on the front side of the substrate 100. The lithography mask at this step may be a version of the original mask from which the mirror lithography mask was derived, as discussed above. In FIG. 5, the substrate 100 is shown after an etch step removes portions of the substrate 100 in the areas where the substrate 100 was exposed by the openings 112 in the photoresist layer 110, and after removing the photoresist layer 110, such as by an ash/flush process. The etch may be performed using an anisotropic etch. FIG. 6 illustrates the substrate 100 after a thermal oxidation step forms an oxide layer 114, such as silicon oxide and/or the like, on exposed surfaces of the substrate 100. The combined etch steps described above result in TSV openings 116 penetrating through the substrate 100.

In FIG. 7, there is shown the substrate 100 with a conductive foil 118, such as a copper foil, adhered to the back side of the substrate 100. The conductive foil 118 may be adhered by using, for example, a molding or punching process. The conductive foil 118 may also be a copper alloy, titanium, and/or the like. FIG. 8 shows the substrate 100 after a conductive material 120, such as a metal like copper, tungsten, aluminum, silver, combinations thereof, and/or the like, has been deposited into the TSV openings 116. The conductive material 120 may be deposited using, for example, an electroplating process. In FIG. 9, the substrate 100 is shown after a planarization process, such as a chemical mechanical polish (CMP), to remove excess conductive material 120. TSVs 122 are thus formed.

FIGS. 10 through 16 show the substrate 100 during back end of the line processing. In FIG. 10, there is shown a passivation layer 124 formed on the front side of the substrate 100. The passivation layer 124 may be a silicon oxide, silicon nitride, silicon oxynitride, a polymer material, any combination thereof, or the like and may be formed using an acceptable deposition technique, such as a CVD process. The passivation layer 124 may be planarized using, for example, a CMP. With reference to FIG. 11, there is shown the substrate 100 after the conductive foil 118 is removed from the back side of the substrate 100. The conductive foil 118 may be removed using, for example, a wet etch process.

In FIG. 12, one or more back side metallization layers 126 may be formed on the back side of the substrate 100. The metallization layers 126 may be borophosphosilicate glass (BPSG), un-doped silicate glass, silicon oxide, silicon nitride, silicon oxynitride, a combination thereof, and/or the like, formed by any appropriate deposition technique, such as a CVD process. Within the metallization layers 126 are interconnect structures that are electrically coupled to the TSVs 122. The interconnect structures may be formed using an acceptable lithography process, such as a dual damascene or damascene process. The interconnect structures may comprise a metal, such as copper, nickel, aluminum, tungsten, titanium, combinations thereof, and/or the like. An outermost metallization layer from the substrate 100 has a pattern of the interconnect structures that align with contacts of a contact board of a probe card, as discussed in further detail with respect to FIG. 17. A layer of excess conductive material 128 may be formed over the one or more metallization layers 126 during the formation of the interconnect structures, and a passivation layer 130 is formed over the excess conductive material 128, if present. The passivation layer 130 may be silicon oxide, silicon nitride, silicon oxynitride, a polymer material, any combination thereof, or the like and may be formed using an acceptable deposition technique, such as a CVD process.

In FIG. 13, there is shown that TSVs 122 are exposed through the passivation layer 124, such as by etching the passivation layer 124. The etching process may include, for example, an acceptable lithography technique and anisotropic etch. In FIG. 14, conductive posts 134 are formed on the portions of the TSVs 122 that are exposed through the passivation layer 124. The conductive posts 134 may be formed by electroplating the exposed portions of the TSVs 122 with a conductive material, such as copper, a copper alloy, gold, a combination thereof, and/or the like, and immersing the electroplated conductive material with a protective conductive material, such as gold and/or the like. By using the mirror lithography mask in forming the TSVs 122, the conductive posts 134 formed on the TSVs 122 may align with and contact conductive bumps on dies of a wafer, wherein the pattern of the conductive bumps was formed using an original version of a lithography mask from which the mirror lithography mask is derived.

Figure 15:
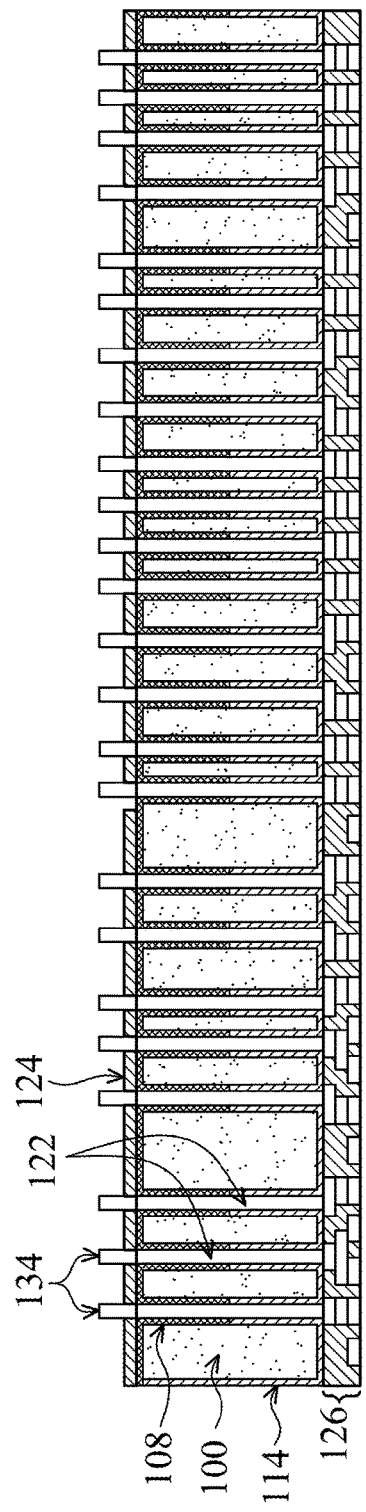

With reference to FIG. 15, there is shown the substrate 100 after any excess conductive material 128 and the passivation layer 130 are removed, such as by CMP, to expose the interconnect structures through the exterior surface of the one or more metallization layers 126. FIG. 16 illustrates the substrate 100 after conductive bumps 136 are formed on the exposed portions of the interconnect structure. The conductive bumps 136 may be formed by immersing the exposed interconnect structures in another conductive material, such as gold and/or the like. Because the outermost metallization layer from the substrate 100 has a pattern of the interconnect structures that align with contacts of a contact board of a probe card, the conductive bumps 136 may align with the contacts of the contact board.

FIG. 17 illustrates components of a probe card according to an embodiment. In FIG. 17, there is shown a docking board 10 of a probe card. On the docking board 10 may be an adoption ring 12 that is capable of clamping or securing the probe card contact pad interface 16 to the docking board 10. As another embodiment or in addition to the current embodiment, a vacuum system may be used to secure the probe card contact pad interface 16 to the docking board 10. The probe card contact pad interface 16 may be the interface discussed above with respect to FIGS. 1 through 16.

Contacts 14 on the contact board of the docking board 10 may be arranged in a uniform array, i.e. equal spacing between adjacent contacts in perpendicular directions in a plane parallel to the docking board 10 bottom surface. Conductive bumps 136, such as those discussed with regard to FIG. 16, formed on the back side of the probe card contact pad interface 16 align with the contacts 14 on the contact board. Accordingly, the conductive bumps 136 are also arranged in a uniform array.

FIG. 17 further illustrates a wafer 18 comprising dies having conductive bumps 20 formed thereon. The conductive bumps 20 may or may not be formed in a uniform manner, and usually, the bumps are not formed in a uniform array. Thus, using the mirror lithography mask, as discussed with respect to FIG. 1, and forming the TSVs 122 by use of the pattern of the mirror lithography mask allows the conductive posts 134 formed on the front side of the probe card contact pad interface 16 to align with the conductive bumps 20 on the wafer 18. Accordingly, using the probe card contact pad interface 16 secured to the docking board 10 may allow for a plurality, or all, of the dies on the wafer 18 to be contacted and tested simultaneously. This allows for higher throughput in manufacturing processes.

Other configurations of a probe card contact pad interface contemplate that the mirror mask used in forming the TSVs is a mirrored version of the contacts 14 on the contact board of the docking board 10. In this manner, the TSVs may align with the contacts 14 instead of the conductive bumps 20 on the wafer. One or more metallization layers with interconnect structures may be used in such a situation to distribute and align conductive posts with the conductive bumps 20 on the wafer 18. Even further embodiments contemplate that TSVs are not aligned with either of the contacts 14 or the conductive bumps 20. Rather, metallization layers may be formed on both the front side and the back side of the probe card contact pad interface to redistribute electrical connections between the TSVs and the contacts 14 or the conductive bumps 20. A person having ordinary skill in the art will readily understand modifications that may be required in the processes to form such embodiments, and therefore, discussion of those processes are omitted for brevity.

With reference to FIG. 18, there is shown a method for testing semiconductor devices according to another embodiment. In step 200, a probe card having a contact pad interface, similar to the one discussed above with respect to FIG. 17, is provided. In step 202, the conductive posts, such as conductive posts 134, of the contact pad interface are simultaneously coupled to conductive bumps of a plurality of dies on a semiconductor wafer, such as conductive bumps 20 of wafer 18. In an embodiment, conductive bumps of all dies on a semiconductor wafer may be simultaneously coupled to the conductive posts of the contact pad interface. In another embodiment, however, less than all of the dies are coupled to the contact pad interface. In step 204, a test signal is transmitted through the contact pad interface, via the conductive posts, to the semiconductor wafer, via conductive bumps on the dies. One or more test signal may be transmitted, and the same or different test signals may be transmitted simultaneously to multiple or all of the dies on the semiconductor wafer. In step 206, a result signal is received from the semiconductor wafer. The result signal may be one signal or multiple signals. The result signal may then be analyzed according to acceptable methods to determine if the dies on the wafer function correctly.

In accordance with an embodiment, a probe card comprises a contact pad interface comprising front side contacts and back side contacts electrically coupled together. The front side contacts are arranged to simultaneously electrically couple respective bumps of a plurality of dies on a wafer, and the back side contacts are arranged to electrically couple respective contacts of a testing structure.

Another embodiment is a method for forming a probe card. The method comprises providing a substrate, the substrate having a first side and a second side; forming through substrate vias (TSVs) extending through the substrate from the first side to the second side; forming first conductive features adjoining the TSVs on the first side of the substrate; forming interconnect structures on the second side of the substrate, the interconnect structures being electrically coupled to the TSVs; and forming second conductive features adjoining the interconnect structures. Forming the TSVs includes using a mirror lithography mask.

A further embodiment is a method for testing semiconductor devices. The method comprises providing a probe card, the probe card comprising a contact pad interface, the contact pad interface comprising first contacts; simultaneously coupling the first contacts to conductive bumps of a plurality of dies on a semiconductor wafer; transmitting a first test signal through the contact pad interface to the semiconductor wafer; and receiving a result signal from the semiconductor wafer.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A probe card comprising:
a contact pad interface comprising front side contacts and back side contacts electrically coupled together, the front side contacts being arranged to simultaneously electrically couple respective bumps of a plurality of dies on a wafer, and the back side contacts being arranged to electrically couple respective contacts of a testing structure, wherein the contact pad interface further comprises:
a substrate with a front side and a back side, the back side being opposite from the front side, wherein the front side contacts are on the front side, and the back side contacts are on the back side;
through substrate vias (TSVs) penetrating through the substrate and electrically coupling the front side contacts to respective back side contacts; and
interconnect structures on at least one of the front side and the back side electrically disposed between the TSVs and the front side contacts or the back side contacts.

2. The probe card of claim 1, wherein the front side contacts are arranged to simultaneously electrically couple the respective bumps of all of the dies on the wafer.

3. The probe card of claim 1, wherein the testing structure comprises a docking board secured to the contact pad interface, the docking board comprising a contact pad, the contact pad comprising board contacts, the board contacts being the contacts of the testing structure.

4. The probe card of claim 3, wherein the contact pad interface is secured to the docking board by a clamp.

5. The probe card of claim 3, wherein the contact pad interface is secured to the docking board by a vacuum system.

6. The probe card of claim 1, wherein the interconnect structures are on the back side and are electrically disposed between the TSVs and the back side contacts, and wherein the front side contacts directly adjoin the TSVs.

7. The probe card of claim 1, wherein the front side contacts are arranged in a uniform array, and the back side contacts are arranged in a non-uniform group.

8. A probe card comprising:
a docking board comprising docking contacts; and
a contact pad interface comprising first contacts and second contacts, the first contacts being on a first side of the contact pad interface, the second contacts being on a second side of the contact pad interface opposite from the first side, the first contacts being directly coupled to the docking contacts, the contact pad interface comprising through vias aligned with respective ones of the first contacts or with respective ones of the second contacts, wherein the contact pad interface further comprises:
a substrate, the through vias penetrating through the substrate and electrically coupling the first contacts to respective second contacts; and
interconnect structures disposed between the substrate and at least ones of the first contacts and the second contacts.

9. The probe card of claim 8 further comprising a securing mechanism securing the contact pad interface to the docking board.

10. The probe card of claim 9, wherein the securing mechanism comprises a clamp.

11. The probe card of claim 9, wherein the securing mechanism comprises a vacuum.

12. The probe card of claim 8, wherein the second contacts are arranged to simultaneously electrically couple respective bumps of all dies on a wafer.

13. The probe card of claim 8, wherein the interconnect structures are disposed between the first contacts and the substrate, the first contacts directly coupling respective ones of the through vias.

14. The probe card of claim 8, wherein the interconnect structures are disposed between the second contacts and the substrate, the second contacts directly coupling respective ones of the through vias.

15. A probe card comprising:
a docking board having a uniform array of docking contacts;
a contact interface comprising first contacts on a first side of the contact interface and second contacts on a second side of the contact interface opposite from the first side of the contact interface, the first contacts being electrically coupled to the second contacts, the first contacts directly contacting the docking contacts, the second contacts being configured to simultaneously couple die contacts of a plurality of dies, wherein the contact interface further comprises through vias electrically coupling the first contacts with the second contacts, and wherein the contact interface further comprises interconnect structures; and
a securing mechanism fixing the contact interface to the docking board.

16. The probe card of claim 15, wherein ones of the first contacts or ones of the second contacts being aligned with respective ones of the through vias.

17. The probe card of claim 16, wherein the interconnect structures are disposed between the through vias and the ones of the first contacts or the ones of the second contacts that are not aligned with the respective ones of the through vias.

18. The probe card of claim 15, wherein the securing mechanism comprises a clamp, a vacuum system, or a combination thereof.

19. The probe card of claim 1 further comprising a passivation layer on the front side of the substrate.

20. The probe card of claim 1, wherein the back side contacts are conductive bumps.

* * * * *